United States Patent [19] [11] Patent Number: 4,943,955
Rabian et al. [45] Date of Patent: Jul. 24, 1990

[54] ATOMIC CLOCK

[75] Inventors: Jean Rabian, Sainte Luce/Loire; Jean-Claude Potet, Suce/Erdre; Michel Buchon, St. Mars Du Desert, all of France

[73] Assignee: Societe D'Etudes, Recherches et Constructions Electroniques - Sercel, Carquefou, France

[21] Appl. No.: 317,962

[22] Filed: Mar. 2, 1989

[30] Foreign Application Priority Data

Mar. 3, 1988 [FR] France .................. 88 02706

[51] Int. Cl.[5] .......................... G04C 15/00; H03L 7/26
[52] U.S. Cl. .................................. 368/156; 368/200; 331/3
[58] Field of Search .................. 331/3, 94.1, 250, 251; 368/155, 156, 200, 202

[56] References Cited

U.S. PATENT DOCUMENTS 4,146,848 3/1979 Hellwig et al. .......................... 331/3
4,158,286 6/1979 Reinberg .................................. 331/3
4,331,933 5/1982 Allan et al. .............................. 331/3
4,425,653 1/1984 Cutler ...................................... 331/3
4,692,916 9/1987 De Marchi et al. .................... 331/3

Primary Examiner—Vit W. Miska
Attorney, Agent, or Firm—Blakely, Sokoloff Taylor & Zafman

[57] ABSTRACT

An atomic clock of the type comprising a quartz oscillator, a tube containing a material, the atoms of which have an hyperfine spectral transition, control means capable of generating, from the quartz oscillator, a control signal of a frequency that corresponds to the hyperfine spectral transition, and of applying this control signal to the tube to cause interaction between this signal and the atoms of the material contained in the tube, and feedback means that are sensitive to the response of the tube and are adapted to modifying the frequency of the quartz oscillator so as to substantially center the frequency of the control signal on the frequency of the hyperfine spectral transition, wherein the control means are adapted to cyclically generate test signals, the controlled frequency of which is located outside the Ramsey peak.

32 Claims, 9 Drawing Sheets

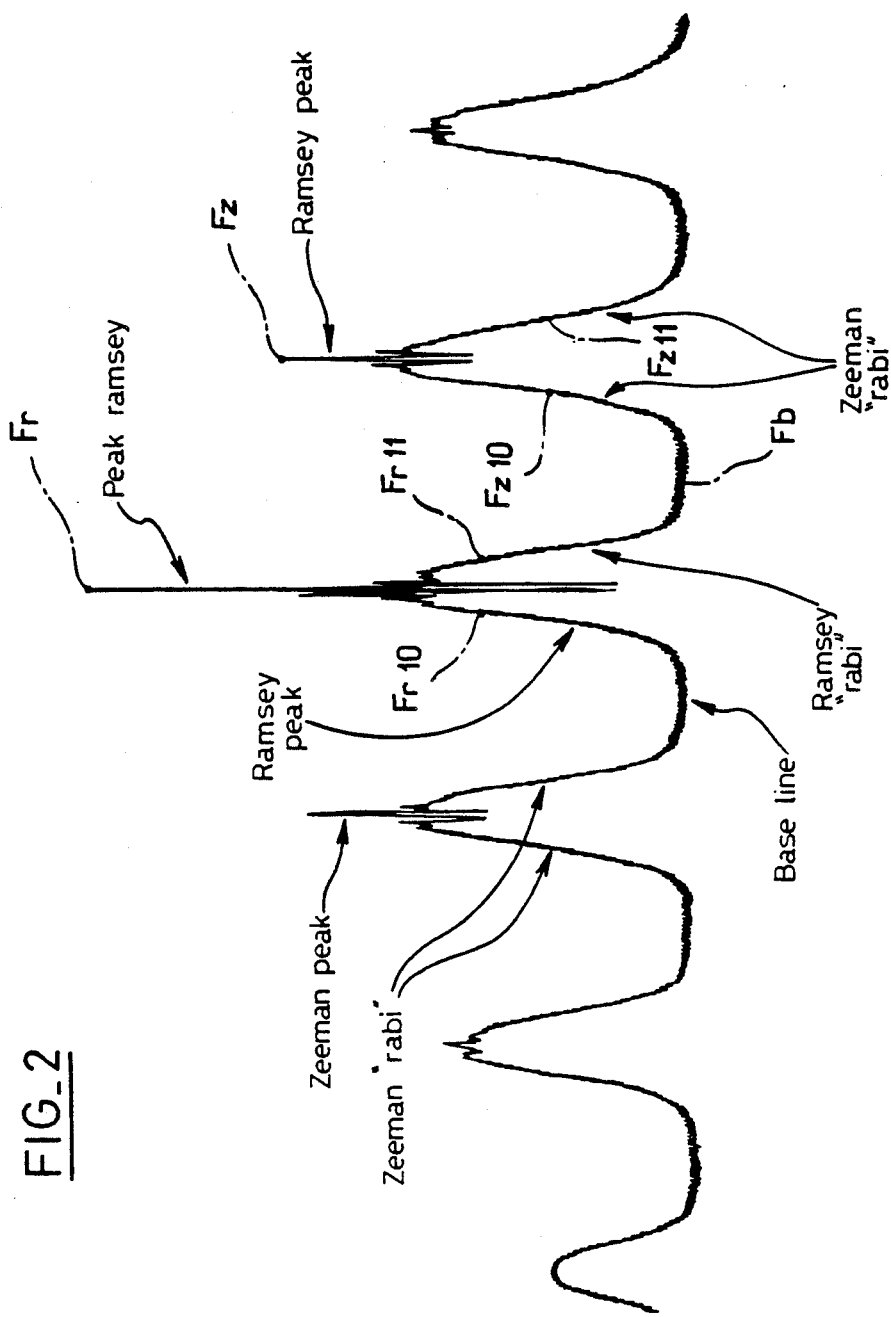
FIG_2

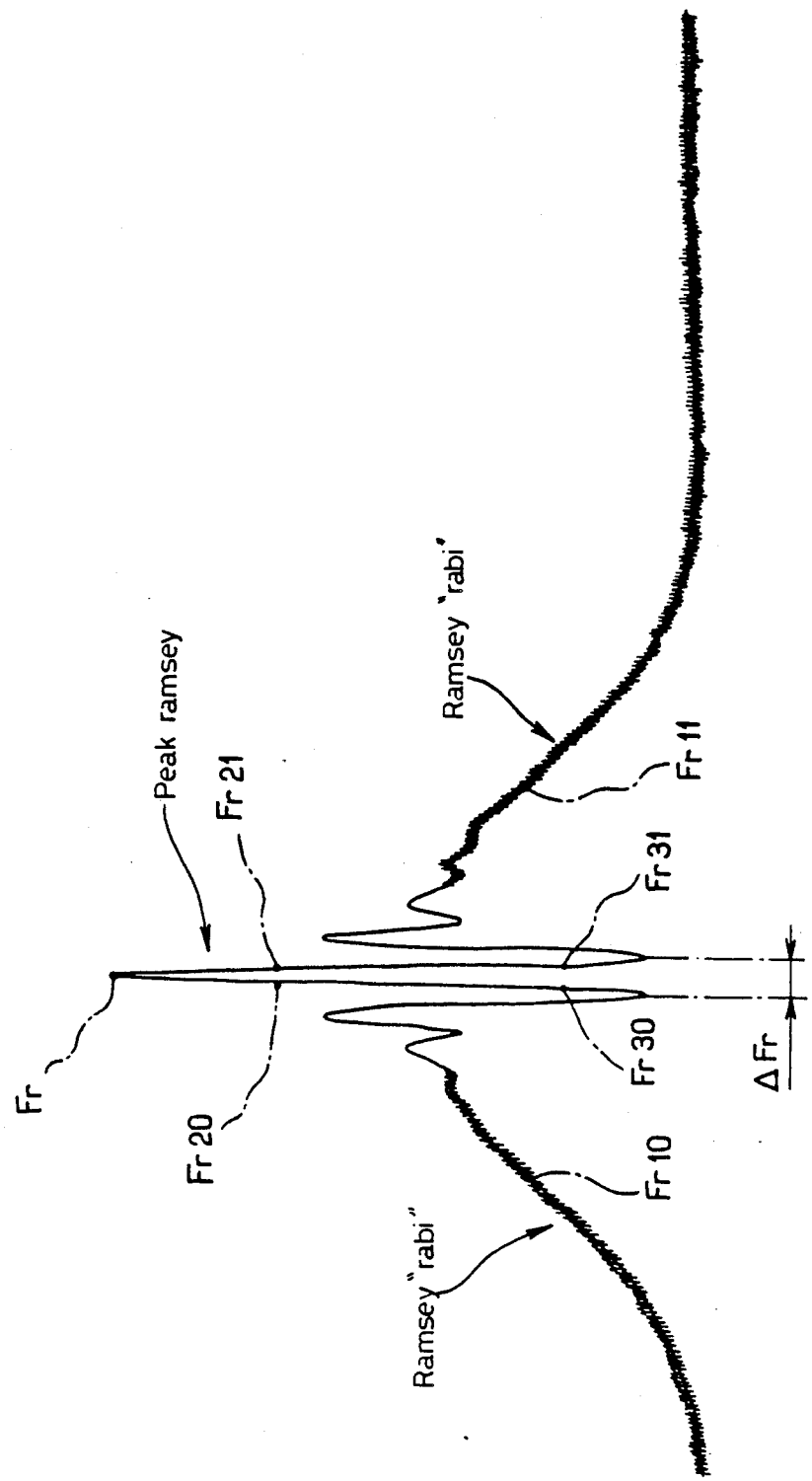

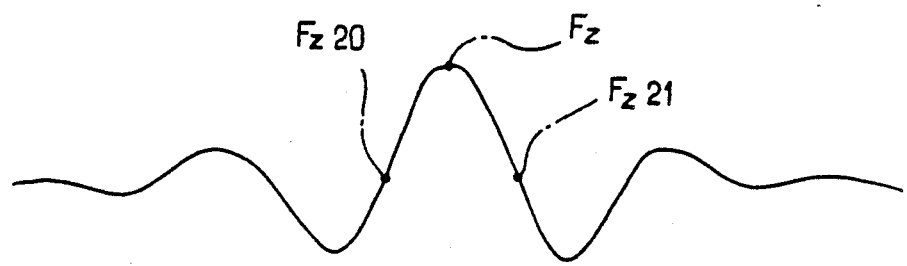
FIG_4
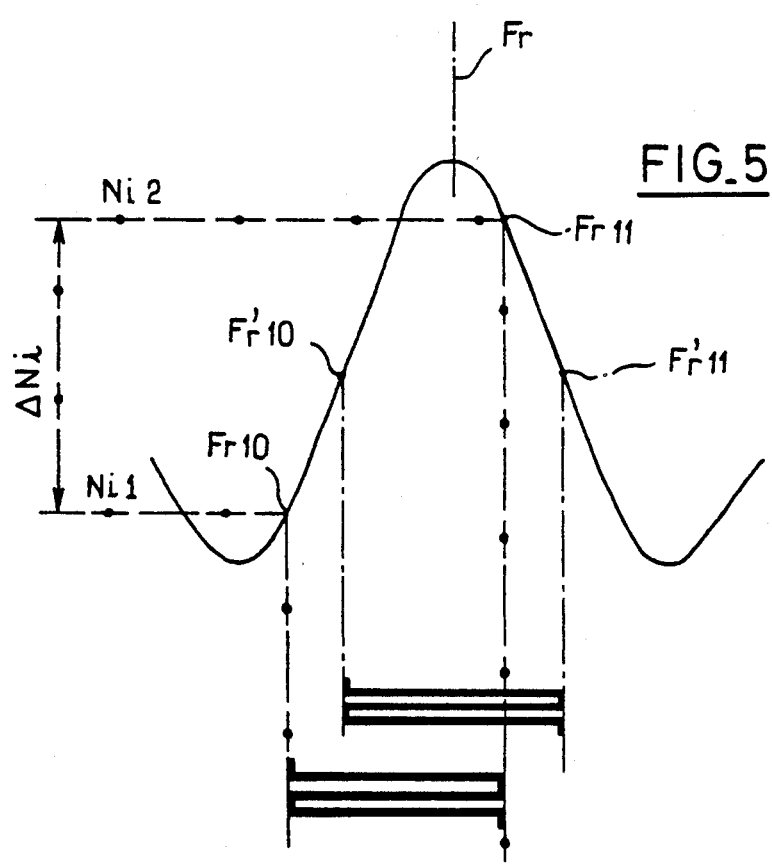
FIG_5

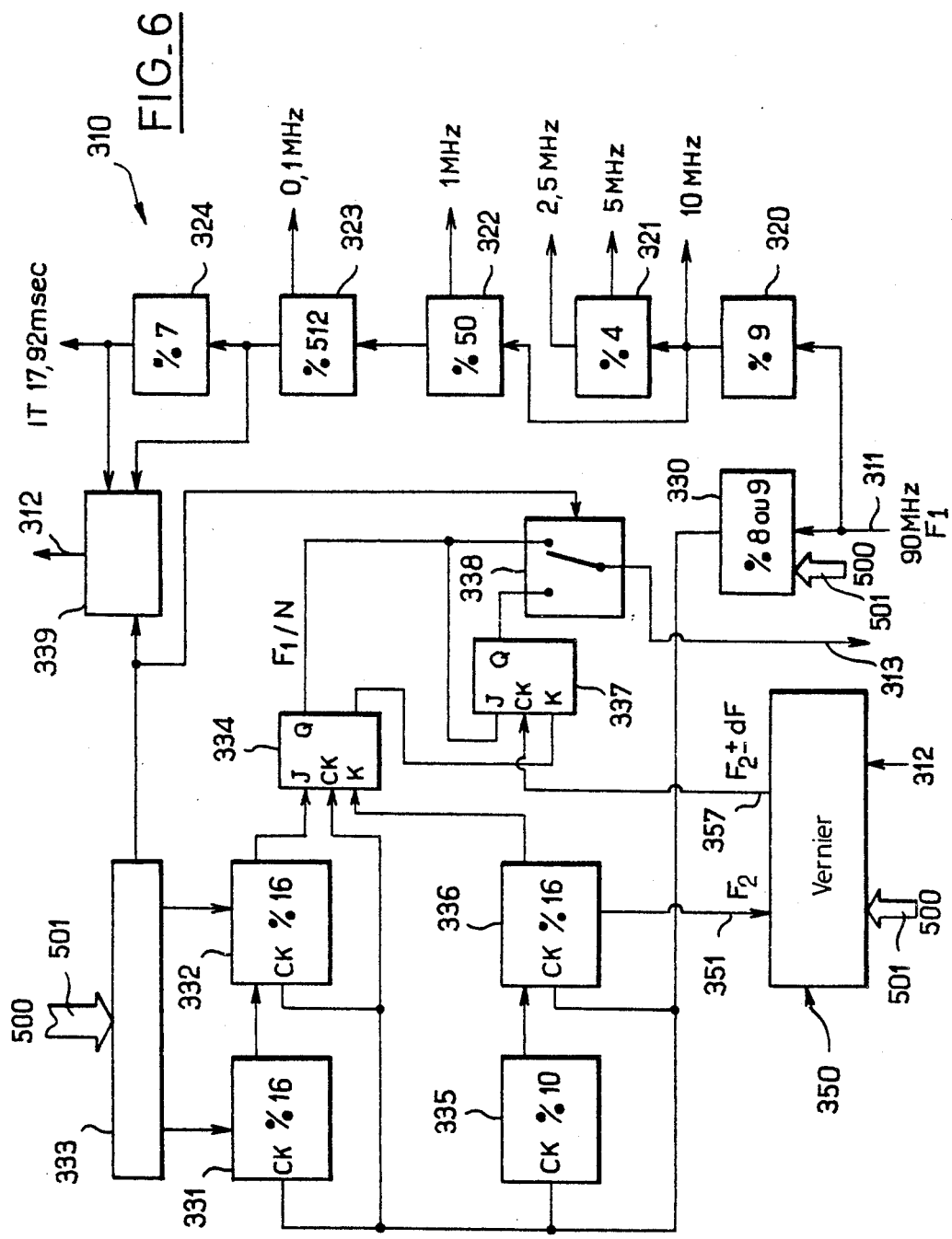

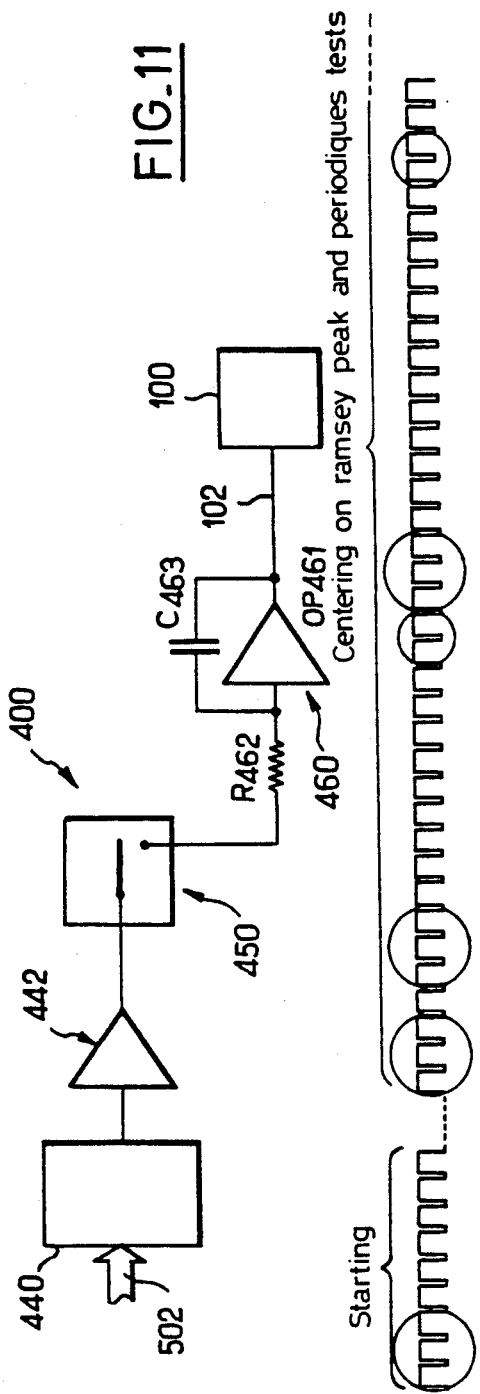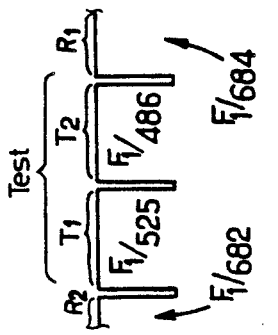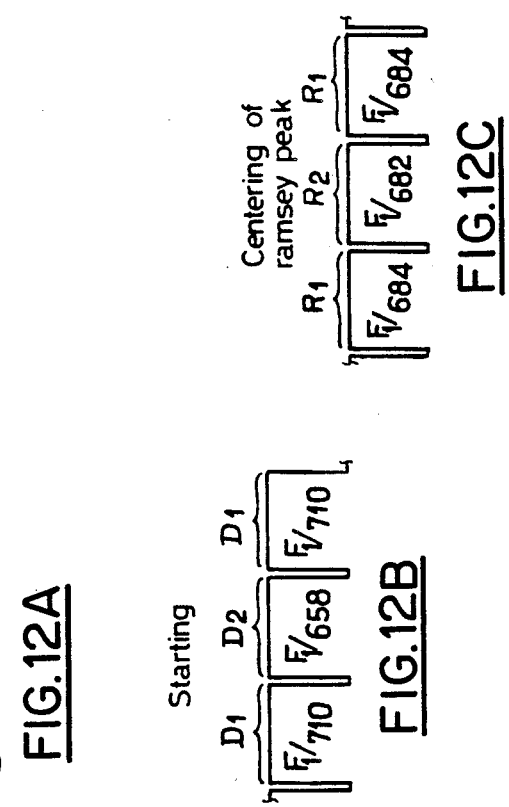

ATOMIC CLOCK

BACKGROUND OF THE INVENTION

1. Field of the Invention

The present invention concerns the field of atomic clocks and especially, but not exclusively, cesium beam frequency standards.

2. Description of the Prior Art

Many atomic frequency standards have been proposed. The following documents describe, for example, standards of this type: FR-A-1 287 180, FR-A-1 446 675, FR-A-1 594 565, FR-A-2 163 610, FR-A-2 206 539, FR-A-2 224 901, FR-A-2 316 836 and FR-A-2 327 671.

Essentially, atomic frequency standards generally comprise:
  a quartz oscillator,
  a tube containing a material (most usually an alkaline metal such as cesium or rubidium), the atoms of which have an hyperfine spectral transition;
  control means capable of generating, from the quartz oscillator, a control signal of a frequency that corresponds to the hyperfine spectral transition, and of applying this control signal to the tube to cause interaction between this signal and the atoms of the material contained in the tube; and
  feedback means that are sensitive to the response of the tube and adapted to modifying the frequency of the quartz oscillator so as to substantially center the frequency of the control signal on the frequency of the hyperfine spectral transition.

In connection with cesium tubes, it is common to use the hyperfine resonance transition that occurs between the states $F=4$, $nF=0$ on the one hand, and $F=3$ and $mF=0$ on the other hand. The definition of these states is explained in the above-mentioned documents, especially in the documents: FR-A-1 594 565 and FR-A-2 316 836.

To cause a transition from one of these states to the other, the atom should either give or absorb a quantity of energy E equal to the difference in energy between the above-mentioned states. The frequency f of the control signal required to cause a change in state is given by the equation $f=E/h$ where h represents Planck's constant.

The value of f for the transition of cesium of $F=4$, $mF=0$ to $F=3$, $mF=0$ is 9 192 631 771.59 Hz. This value of f shall hereinafter be called Fr.

The tubes containing the material, the atoms of which have an hyperfine spectral transition, are known per se and shall therefore not be described in detail hereinafter. It will be noted, however, that cesium tubes generally comprise: a furnace generating a beam of cesium atoms through a collimator, a microwave cavity at which the control signal is coupled to the stream of cesium atoms, magnetic state selecting means placed on either side of the cavity and a detector unit comprising an ionizer, an accelerator, a mass spectrometer and an electron multiplier. The electron multiplier delivers an output current which is proportionate to the number of atoms arriving at the ionizer and, therefore, proportionate to the number of atoms which have been brought to the selected state in the microwave cavity.

The resonance signal obtained at the output of the tube, as a function of the frequency of the control signal applied, is shown schematically in the appended FIGS. 2, 3 and 4.

The signal shown in FIG. 3 is generally called the Ramsey response. It represents the total transfer function of the tube.

The signal has a maximum amplitude when the frequency of the control signal applied is equal to the frequency of the hyperfine spectral transition Fr (namely, 9 192 631 771.59 Hz in the case of cesium). The peak centered on this frequency Fr is called the Ramsey peak. This peak is symmetrically framed by dampened stray oscillations of smaller amplitude (see FIG. 3). The base line is linked to these dampened stray oscillations by variably sloping, symmetrical base sides, generally called the "Rabi" of Ramsey.

The frequency band $\Delta Fr$ (see FIG. 3) covered by the central Ramsey peak depends directly on the length of the stream of atoms and, hence, on the length of the tube. The longer the tube, the smaller is the width of the Ramsey peak.

Certain atomic frequency standards used in laboratories are 5 m long, thus making it possible to reduce the width of the Ramsey peak $\Delta Fr$ to some 30 Hz. Industrially used atomic frequency standards, especially in the context of mobile applications, are far shorter in length, and the width of the Ramsey peak $\Delta Fr$ is generally of the order of 1 KHz.

The Ramsey response further includes auxiliary resonance phenomena, symmetrically on either side of the central Ramsey peak. These auxiliary resonance phenomena appear at regular frequency intervals. The amplitude of these auxiliary resonance phenomena is all the weaker as they are distant from the Ramsey peak. Each auxiliary resonance placed on either side of the Ramsey peak, which are closest to this peak, has a peak of greater amplitude (which remains smaller than the Ramsey peak) called the Zeeman peak, dampened stray oscillations symmetrically framing the Zeeman peak and variably sloping base sides, generally called the Rabi of Zeeman, which link the dampened stray oscillations to the base line.

To produce a signal which can be used to command the feedback controlled oscillator, the frequency of the control signal applied to the microwave cavity is modulated around the central atomic resonance frequency Fr corresponding to the Ramsey peak.

In practice, in atomic frequency standards being marketed at present, the control signal is modulated by a low sinusoidal frequency at 137 Hz on a depth ±250 Hz, namely, the width of the Ramsey peak at mid-amplitude.

The atomic frequency standards proposed up till now have already been very useful. However, they have different drawbacks.

The main drawback of conventional standards would appear to be the fact that the checks on the acquisition of the central peak of the Ramsey response are unreliable.

Other secondary drawbacks in conventional standards seem to be due to the fact that:
  these conventional standards are sensitive to the environment, notably to temperature;
  the linearity of the sinusoidal frequency modulator at 137 Hz is difficult to control;
  the settings to be made are many and complicated;
  the overall cost of the devices is high.

SUMMARY OF THE INVENTION

It is an object of the present invention to remove the above-mentioned drawbacks of the prior art and ensure excellent long-term dependability for the clock.

This goal is achieved, according to a fundamental aspect of the present invention, through the use of control means that are capable of cyclically generating test signals, the monitored frequency of which is located outside the Ramsey peak.

The choice of the frequency of the test signals shall be explained further below. These test signals can be used inter alia to initially center the frequency of the control signal on the Ramsey Rabi and to ascertain that the control signal is not erroneously centered on a stray oscillation adjacent to the Ramsey peak.

The control means advantageously comprise a microprocessor-controlled fast switching-over frequency synthesizer with small frequency steps. The operating range of the synthesizer may be, advantageously, of the order of 55 KHz.

According to a second important aspect, the present invention proposes to integrate a system, in the control means, that fulfills the vernier function to enable the tuning of the frequency of the control signal. The vernier system proposed enables the frequency to be tuned with a resolution of $10^{-13}$ in a range of $2.10^{-10}$.

According to a third major aspect, the present invention proposes amplifier/integrator means for the output signal of the tube, enabling short and stable interfacing between the output signal of the tube and an analog/digital converter.

According to a fourth major aspect, the present invention proposes means that enable the resolution of the feedback command of the quartz oscillator to be optimized. These means essentially comprise a digital/analog converter, an analog gate with a controlled closing time and an integrator. The definition is optimized by controlling the amplitude and duration of charge pulses applied to the integrator.

BRIEF DESCRIPTION OF THE DRAWINGS

Other features, aims and advantages of the present invention will appear from the following detailed description, made with reference to the appended drawings, shows as a non-restrictive example. Of these drawings:

FIG. 2 shows the overall Ramsey response coming from a cesium tube;

FIG. 3 shows an enlarged detailed view of the Ramsey Rabi and peak coming from a cesium tube;

FIG. 4 shows an enlarged detailed view of the Zeeman peak coming from a cesium tube;

FIG. 5 gives a schematic illustration of the control of the centering of the control signal on the hyperfine transition frequency of cesium;

FIG. 6 gives a schematic view, in the form of functional blocks, of the frequency synthesizer integrated in the atomic clock according to the present invention;

FIG. 11 gives a schematic view, in the form of functional blocks, of means enabling the resolution of the feedback command of the quartz oscillator to be optimized;

FIGS. 12A–12D give a schematic illustration of the general operation of the atomic clock according to the present invention.

DESCRIPTION OF A PREFERRED EMBODIMENT

In the rest of this description, we shall mention precise values of frequencies generated by the different sub-units of an atomic clock, according to a preferred embodiment of the present invention, for purposes of clarification.

However, the precise frequency values indicated in the rest of the description should in no way be considered to be restrictive.

GENERAL STRUCTURE OF THE ATOMIC CLOCK

Figure 1:
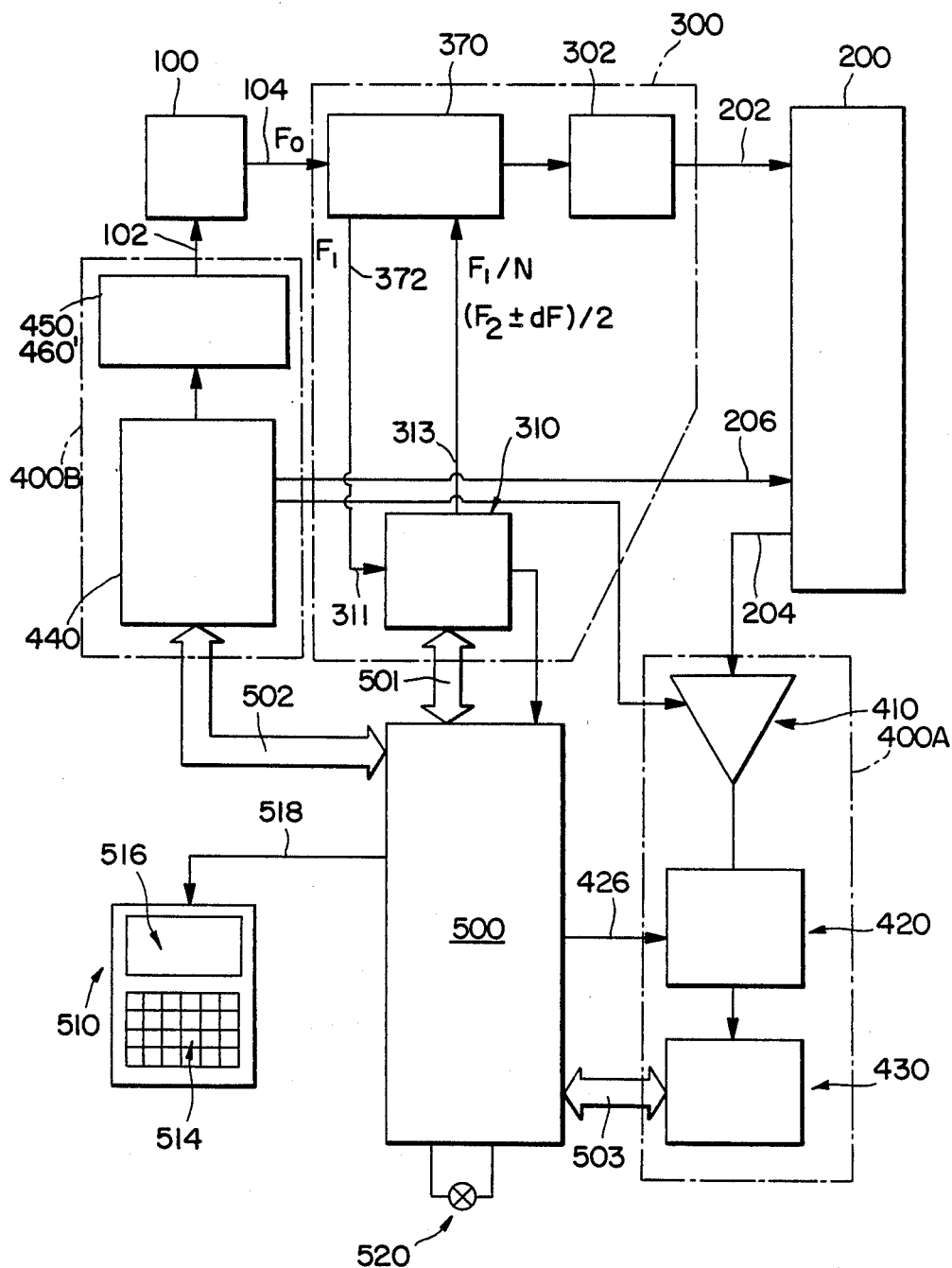
FIG. 1 shows a schematic view, in the form of functional blocks of the atomic clock unit according to the present invention.

As shown in the appended FIG. 1, the atomic clock according to the invention essentially comprises:
an oscillator 100,
a tube 200,
control means 300,
feedback means 400, and
a central processing unit 500.

The oscillator 100 is advantageously a quartz oscillator. The frequency Fo, coming from the oscillator 100, can be set by means of an external signal applied to the input 102 of the oscillator. The frequency Fo of the signal available at the output 104 of the oscillator is, for example, 10 MHz.

The tube 200 contains a material, the atoms of which have an hyperfine spectral transition. The tube 200 is preferably a tube of cesium or, as the case be may, of rubidium.

The control signal, designed to cause the change in state of the cesium atoms in the microwave cavity, is applied to the input 202 of the tube. The signal, with a current proportionate to the number of atoms reaching the ionizer of the tube 200, is available at the output 204.

In examining FIG. 1, it will be seen that the tube 200 further has an ancillary input 206. This input is connected to a winding designed to create a weak and homogeneous field in the microwave interaction cavity. This field is generally known as a C field as indicated, for example, in the document FR-A-2 316 816.

In a manner known per se, the central processing unit 500 comprises a microprocessor associated with an internal clock and memories. The central processing unit 500 may be remote controlled by means of a peripheral 510 with a keyboard 514 and a screen 516. The peripheral 510 is connected to the central processing unit by a series link 518. The central processing unit 500 is, moreover, connected to warning indicators 520, such as indicator lamps.

A more detailed description shall now be given of the control means 300 and the feedback means 400 according to the present invention.

CONTROL MEANS 300

The main function of the control means 300 is to generate a control signal by means of the quartz oscillator 100, with the frequency of this control signal corresponding to the hyperfine spectral transition or being modulated symmetrically with respect to the frequency corresponding to the hyperfine spectral transition, to apply this control signal to the input 202 of the tube 200.

However, within the framework of the present invention, the control means 300 also have an additional function of generating test signals, which shall be specified further below, the frequency of which differs from the frequency corresponding to the hyperfine spectral transition of the material contained in the tube 200, as well as fixed signals, in steps from 100 KHz to 10 MHz, on the one hand, and an interruption signal IT on the other.

The interruption signal IT may have, for example, a period of 17.92 msec.

The basic control signal and the test signals are generated from a programmable signal by steps of F1/N added to signals derived from the quartz oscillator 100.

For example, F1=90 MHz and N is programmable from 504 to 710.

The principle of generation of a control signal with a frequency Fr is as follows.

For N=683, the frequency F1/N is equal to 131 771.6 Hz. This frequency F1/N is added to a signal of 12.5 MHz to obtain a signal F4 of 12 631 771.6 Hz. This signal F4 is added to the 90 MHz signal multiplied by 102 to arrive at 9 192 631 771.6 Hz which corresponds to the frequency Fr of the transition of cesium. To generate a frequency excursion of ±193 Hz around the central frequency Fr, in order to produce a signal which can be used to command the feedback controlled oscillator 100, it is enough to alternately program N=682 and N=684. These arrangements shall be explained further below.

Essentially, the control means 300 include a circuit 370 fulfilling frequency multiplication and addition functions, with a circuit 302 fulfilling the function of the multiplication of frequencies by 51 and a circuit 310 forming a programmable frequency synthesizer.

The circuit 372 comprises (see FIG. 13) a first stage 371 performing a multiplication by 9 of the frequency Fo of the clock signal coming from the oscillator 100. The 90 MHz signal F1 available at the output 372 of the circuit 370 is applied to the input 311 of the frequency synthesizer 310.

The 90 MHz signal F1 is first of all directed towards a chain of frequency dividers 320, 321, 322, 323 and 324, cascade mounted as shown in FIG. 6. These frequency dividers may perform, for example, frequency divisions by 9, 4, 50, 512 and 7 respectively, to generate stepped signals of 10 MHz, 5 MHz, 2.5 MHz, 1 MHz and 0.1 MHz respectively. The outputs of the above-mentioned dividers 320 to 323 form the main outputs of the frequency standard. The signals available at these outputs are, in effect, perfectly stable.

Furthermore, the divider 324 generates, at its output, the above-mentioned interruption signal IT, with a period of 17.92 msec for example.

The frequency signal F1, available at the input 311, is moreover applied to a chain of programmable frequency dividers generating the desired signal F1/N at their output.

More precisely, the 90 MHz signal F1, available at the input 311, is applied to a programmable divider 330, performing a division by 8 or 9.

The division factor of the divider 330 is defined by the central processing unit 500 by means of a bus 501.

The output of the divider 330 is applied to the clock inputs CK of two cascade-connected counters which are dividers by 16, referenced 331, 332.

The factor of division of the divider counters 331, 332, is defined by a set of flip-flops 333, defining the initial state of the divider counters 331, 332. The state of the flip-flops 333 is itself controlled by the central processing unit 500 by means of the bus 501.

In parallel, the signal coming from the divider 330 is applied to the clock input CK of two cascade-mounted divider counters 335, 336 which perform a division by 10 and 16 respectively.

The synthesizer 310 comprises a flip-flop JK334. The input J of the flip-flop 334 is connected to the output of the divider counter 332. The clock input CK of the flip-flop 334 is connected to the output of the divider 330. The input K of the flip-flop 334 is connected to the output of the divider 335.

The signal F1/N is available at the output Q of the flip-flop 334.

As indicated above, the atomic clock according to the invention further comprises a vernier 350 enabling fine tuning of the frequency coming from the frequency synthesizer.

VERNIER 350 FOR FINE TUNING OF FREQUENCY

Figure 7:
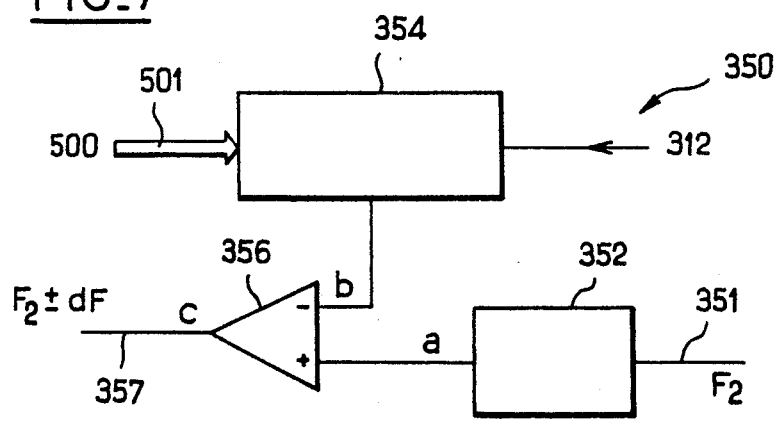
FIG. 7 gives a schematic view, in the form of functional blocks, of the vernier for fine tuning of frequency, integrated into the atomic clock according to the present invention.

The vernier 350 is shown in FIG. 7.

The vernier 350 has a first linear slope generator 350, a second slope generator 354 and a comparator 356.

The input 351 of the linear slope generator 350 is connected to an output of the divider 336 which generates a signal F2 at 263 543.2 Hz (that is, 113 771.6 multiplied by 2). The slope generator 352 is therefore recurrent at this frequency F2.

Figure 8:
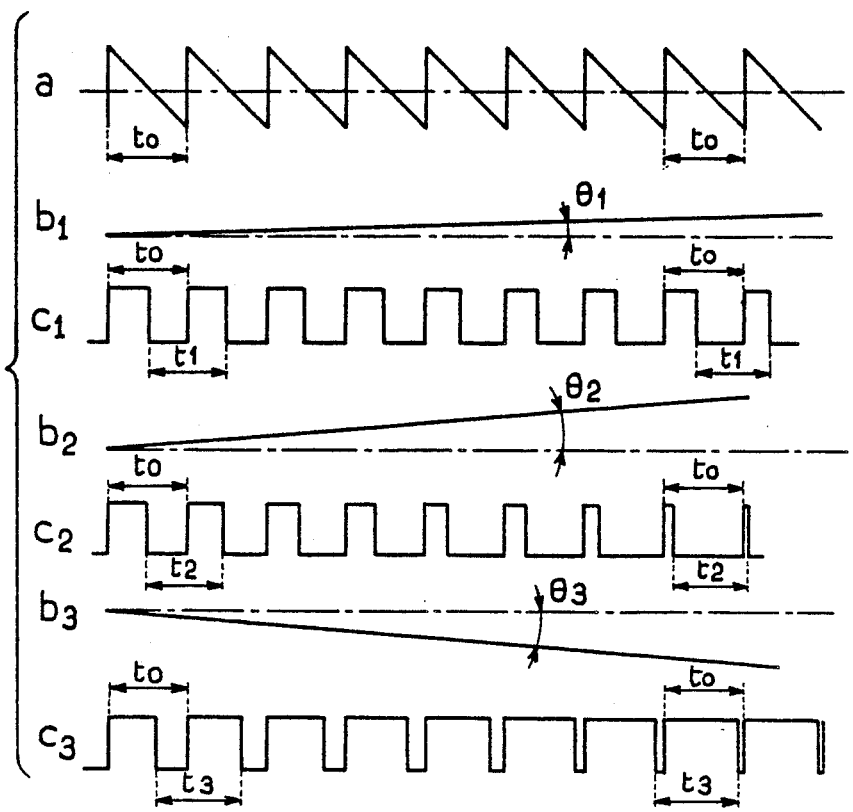
FIG. 8 gives a schematic view of the different signals picked up at the above-mentioned vernier, to explain its operation.

The sawtoothed signal, obtained at the output of the slope generator 352, is illustrated in the first line of FIG. 8. It will be noted that this signal is symmetrical with respect to the ground. Its constant period is referenced $t_0$. It has steep rising edges followed by rectilinear descending edges.

The slope generator 354 receives, at its input, a sequence of pulses, the period of which corresponds to the period of the interruption signals IT, i.e. advantageously 17.92 msec. The pulses applied to the input of the slope generator 354 are generated at the output 312 of a module 339, controlled by the flip-flops 333 and the outputs of the frequency dividers 323 and 324.

The slope generator 354 may be formed by a Miller integrator. The inclination of the slope coming from the generator 354 is adjusted in amplitude and polarity, by means of a digital/analog converter, from the central processing unit 500, through the bus 501.

The second line of FIG. 8 shows an example of a slope $b_1$ coming from the generator 354, with a inclination of positive polarity and an amplitude $\theta_1$.

The fourth line of FIG. 8 shows another example of a slope $b_2$ coming from the generator 354 with a inclination of positive polarity and an amplitude $\theta 2$.

Finally, the sixth line of FIG. 8 shows a slope $b_3$ coming from the generator 354 with a inclination of negative polarity and an amplitude $\theta 3$.

The signals, a and b, coming from the two slope generators 352 and 354, are applied to the inputs of the comparator 356. At its output, the comparator 356 generates a square-wave logic signal c, the frequency of which corresponds to the frequency F2 of the signal applied to the input 351, plus or minus a value dF defined by the programmed value at the output of the associated digital/analog converter.

In effect, the specialist will easily understand that, if the rising edges of the square waveforms of the signal c, coming from the comparator 356, have a constant period $t_0$, equal to the period of the sawtoothed signal coming from the generator 352, the period $t_1$, $t_2$ or $t_3$ between the descending edges of the square wave signal c, coming from the comparator 356, is modulated by the polarity and amplitude of the inclination of the slope b coming from the generator 354. However, the period $t_1$, $t_2$ or $t_3$ between the descending edges of the signal c remains constant for a slope b with a constant inclination. The frequency excursion dF can therefore be set on the basis of the polarity and amplitude of the inclination of the slope b.

The signal $F2\pm dF$, coming from the output 357 of the comparator 356, namely from the vernier 350, is applied to the clock input CK of a flip-flop 337. The input J of this flip-flop 337 is connected to the output Q of the flip-flop 334 while the input K of the flip-flop 337 is connected to the output $\overline{Q}$ of the flip-flop 334. The flip-flop 337 generates an output signal with a frequency $(F2\pm dF)/2$. It will be noted that when $dF=0$, $(F2\pm dF)/2 = F1/683$.

Finally, the frequency synthesizer 310 includes, at output, a gate 338 used as an inverter. The two inputs of the gate 338 are respectively connected to the outputs Q of the flip-flops 334 and 337. The output of the gate 338, which forms the output of the frequency synthesizer 310, is referenced 313. The switching-over of the gate 338 is actuated by the flip-flops 33, controlled by the central processing unit 500.

When the output 313 of the frequency synthesizer 310 is connected to the output Q of the flip-flop 337, the vernier 350 is in service and the frequency $(F2\pm dF)/2$ of the control signal generated can be finely tuned as a function of the amplitude and polarity of the inclination of the slope coming from the generator 354.

When the output 313 of the frequency synthesizer is connected to the output Q of the flip-flop 334, the vernier 350 is not in service. The signals coming from the output 313 of the frequency synthesizer form the frequency F1/N test signals.

Figure 13:
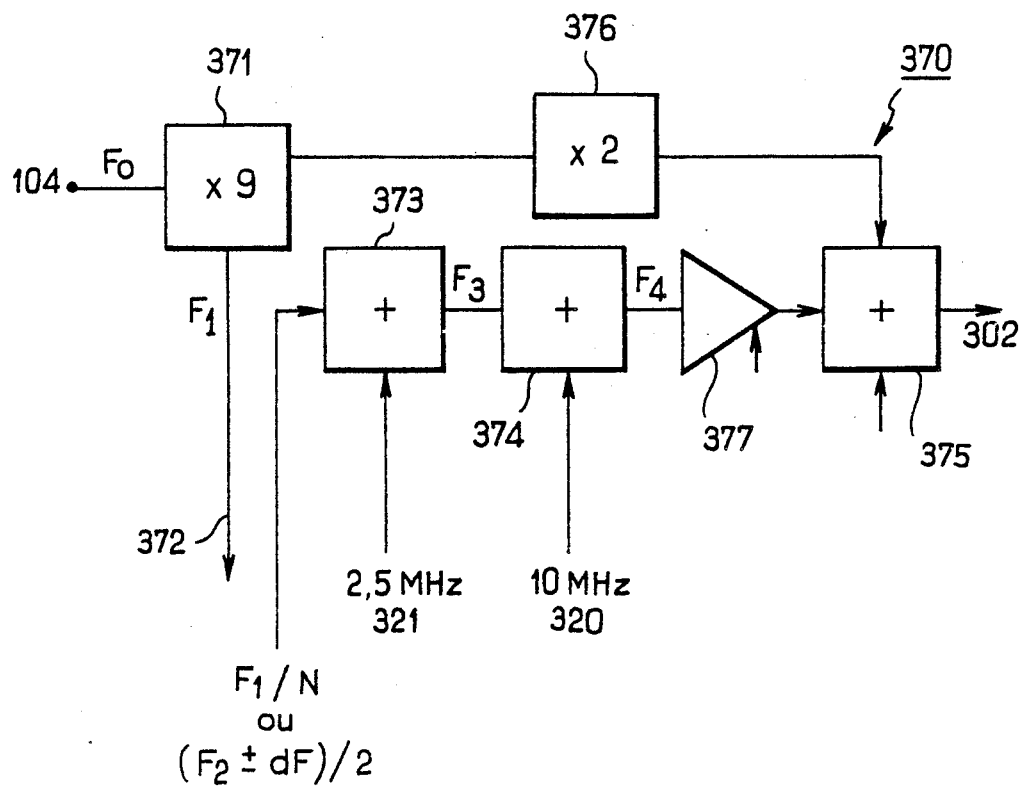
FIG. 13 gives a view, in the form of functional blocks, of an embodiment of a sub-unit, providing for frequency multiplication and addition functions, integrated into the control means according to the present invention.

As indicated above and illustrated in FIG. 13, within the circuit 370, the signal with a frequency F1/N or $(F2\pm dF)/2$ is added in a mixer stage 373 to the 2.5 MHz signal coming from the divider 321, to obtain an intermediate signal with a frequency F3. Then it is added in a mixer stage 374 to the 10 MHz signal coming from the divider 320, to obtain a signal with a frequency F4 of the order of 12.6 MHz. The signal F4 obtained is then added to a 180 MHz signal in a mixer stage 375. The 180 MHz signal is generated in the stage 376 which multiplies the 90 MHz frequency F1 by 2. The frequency of 180 MHz is then multiplied by 51 in the stage 302. The control signal sought, which is applied to the input 202 of the tube, is available at the output of the stage 302.

The vernier 350 may be used to cause a rephasing between two clocks by programming a frequency drift controlled for a pre-defined time.

TUBE OUTPUT SIGNAL AMPLIFIER/INTEGRATOR MEANS 400A

Figure 9:
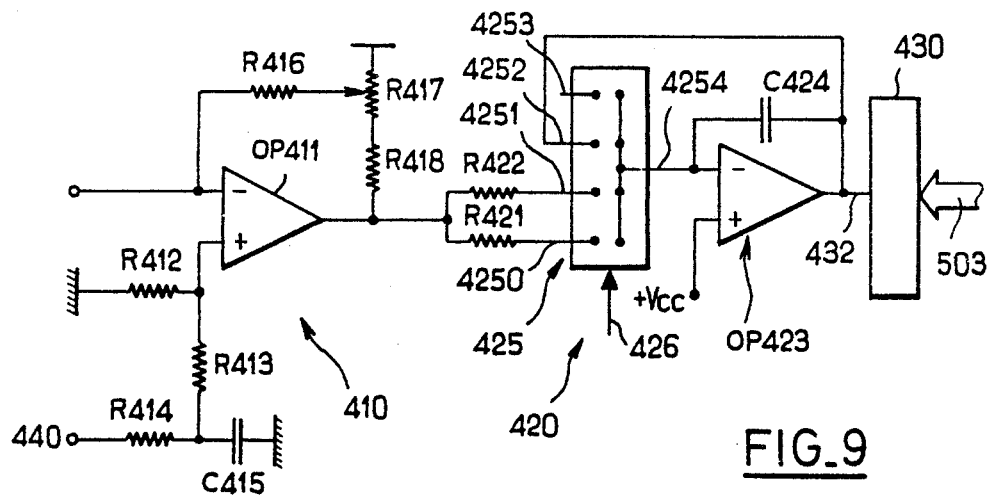
FIG. 9 gives a schematic view, in the form of functional blocks, of the amplifier/integrator means for the output signal the tube.

These means are shown schematically in FIG. 9. The means 400 comprise an amplifier stage 410, an integrator stage 420 and an analog/digital converter 430.

The preamplifier stage 410 is based on an operational amplifier OP 411.

This operational amplifier receives, at its inverter input, the signal coming from the output 204 of the tube 200.

The output of the operational amplifier OP 411 is connected to the ground by means of a resistor R418 and a potentiometer R417 which are in series. The cursor of the potentiometer R417 is looped to the inverter input of the operational amplifier OP 411 by means of a series resistor R 416. The gain of the amplifier stage 410 is tuned by setting the potentiometer R 417.

The non-inverting input of the operational amplifier OP 411 is connected to an offset setting unit.

The non-inverting input of OP 411 is connected to the ground, firstly, by means of a resistor R 412 and, secondly, by means of a branch comprising, in series, a resistor R 413 and a capacitor C 415.

The point common to the resistor R 413 and the capacitor C 415 receives an offset setting voltage through a resistor R 414. This offset setting voltage comes from a digital/analog converter 440 according to arrangements which shall be described hereinafter.

The integrator stage 420 is formed by a Miller integrator based on an operational amplifier OP 423.

The inverter input of the operational amplifier OP 423 is preceded by an analog gate 425. This gate has four inputs and one output. The output of the gate 425 can be connected alternately to any of the above-mentioned inputs, depending on a two-bit driving signal applied to the input 426 of the gate and coming from the central processing unit 500.

The output of the amplifier stage 410 is connected by a first resistor R 421 to the first input 4250 of the gate 425. The output of the amplifier stage 410 is connected by means of a second resistor R 422 to the second input 4251 of the gate 425.

The third input 4252 of the gate 425 is connected to the output of the operational amplifier OP 423. The fourth input 4253 of the gate 425 is unconnected. The output 4254 of the gate 425 is connected to the inverter input of the operational amplifier OP 423.

The capacitor C 424 connects the inverter input of the operational amplifier OP 423 to its output The non-inverter input of the operational amplifier OP 423 is connected to a positive supply terminal +Vcc.

The output of the integrator 420, formed by the output of the operational amplifier OP 423, is connected to the input 432 of the analog/digital converter 430. This analog/digital converter 430 is connected, at output and by means of the bus 503, to the central processing unit 500.

The function of the gate 425 is to choose the amplification gain of the integrator 420, to temporarily store the output voltage obtained to enable its digital conversion by the converter 430, and to cyclically discharge the integration capacitor C 424 before a subsequent acquisition.

As shall be specified further below, the rate of operation of the atomic clock, according to the present invention, is given by the interruption signal IT which has a period of 17.92 msec. During each of these periods, the control means 300 generate a control signal or a test signal of a chosen frequency defined by the frequency synthesizer 310. The feedback means 400, shown in FIG. 9, are aimed at providing for a digital conversion of the output signal of the tube, for each of these elementary 17.92 msec periods.

Figure 10:
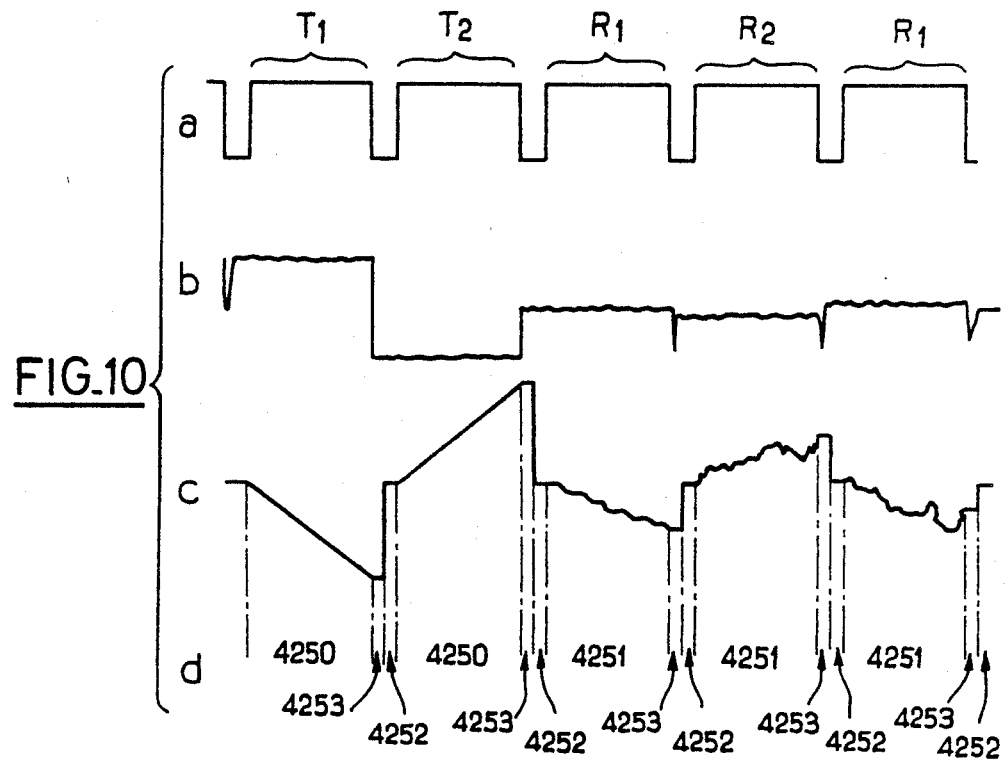
FIG. 10 represents electrical signals picked up at different points of these amplifier/integrator means, to explain their operation.

The first line of FIG. 10 shows the interruption signal IT having a period of 17.92 msec.

The second line of FIG. 10 shows the corresponding signal b obtained at the output of the preamplifier stage 410. Finally, the third line c of FIG. 10 shows the corresponding signal obtained at the output of the integrator 420.

The first two 17.92 msec periods T1, T2 of the signals shown in FIG. 10 correspond, arbitrarily, to the application, to the input 202 of the tube 200, of non-symmetrical test signals of the central frequency Fr of the Ramsey peak. Since the difference in the levels of the signal coming from the output 204 of the tube 200, between its two first periods, is high, the integrator stage 420 is controlled in low gain by the central processing unit 500, through the linking of the output 4254 with the first input 4250. The gain of the integrator stage 420 is then defined by the resistor R 421.

In the following periods R1, R2 of the signals shown in FIG. 10, it is assumed that control signals having a low frequency difference, which is alternately positive and negative, for example ±193 Hz, with respect to the central frequency Fr of the Ramsey peak, are applied to the input 202 of the tube 200.

Since the differences in levels detected at the output signal of the tube 200 are then low, the integrator 420 should have a high gain. For this purpose, the output 4250 is connected to the input 4251. The gain of the integrator 420 is defined by the resistor R422. This resistor advantageously has a resistance value 10 which is ten times smaller than that of the resistor R 421, to define a ratio of 10 between the two possible gains of the integrator 420.

At the end of each 17.92 msec. measuring cycle, the output 4250 is connected to the input 4253 to store the value obtained at the capacitors C 424 and enable the converter 430 to perform the digital conversion. Then, the output 4254 is connected to the input 4252 to discharge the integration capacitor 424 before a following acquisition.

The nature of the input 4250, 4251, 4252 or 4253, connected to the output of the gate 425, is defined in the fourth line of FIG. 10.

The linking time of the inputs 4253 and 4252 to the output 4254 may be of the order of 1 msec respectively.

QUARTZ OSCILLATOR 100 FEEDBACK MEANS 400B

The aim of these means 400 is to optimize the resolution of the feedback.

Essentially, the feedback means 400 shown in FIG. 11 comprise a digital/analog converter 440, an analog gate 450 and an integrator stage 460.

The digital/analog converter 440 is connected to the central processing unit 500 by means of the bus 502.

The output of the converter 440 is connected to the input of the gate 450. If necessary, an amplifier stage 442 may be interposed between the output of the converter 440 and the gate 450.

The integrator 460 defines a second order frequency automatic control loop. This arrangement has the advantage of applying major filtering constants without introducing phase errors as a function of the instability of the oscillator.

The integrator stage 460 consists of a Miller integrator. This stage has an operational amplifier OP 461. The input of the operational amplifier OP 461 is connected to the output of the gate 450 by means of a resistor R 462. The input of the operational amplifier OP 461 is connected to its output by means of an integration capacitor C 463.

The closing time of the analog gate 450 is controlled to define the desired resolution.

In effect, for an oscillator 100 with a range of frequency of $\pm 2.10^{31} 7$, for a pilot signal at its input 102 of ±4 volts, a control resolution of 2 mvolts, obtained directly at the output of a 15 digital/analog converter 440 of 12 bits, would produce a frequency skip of $10^{-10}$.

The means 400 shown in FIG. 11, in accordance to the present invention, can be used to reduce the resolution to $10^{31} {}^{13}$, in bringing the resolution of the pilot signal, applied to the input 102, to $2\mu$ volts.

For this, assuming for example that the resistance of the resistor R 462 is 32 Kohms, and that the capacitance of the capacitor C 463 is 1 $\mu$F, it is enough for the central processing unit 500 to control the closing of the analog gate 450 for 33 $\mu$secs to obtain a step of 2 $\mu$volts.

In other words, the increase in resolution is obtained within the framework of the present invention by generating a charge pulse of the integrator 460 which is, on the one hand, modulated in amplitude by the digital/analog converter 450 and, on the other hand, modulated in duration by the analog gate 450 under the control of the central processing unit 500.

GENERAL OPERATION OF THE ATOMIC CLOCK

As indicated earlier, the rate of operation of the clock is set in elementary periods of 70.92 msec by the interruption signal IT coming from the frequency synthesizer 310.

During a given period of 17.92 msec, the control means 300 apply, to the input 202 of the tube 200, a signal of a determined frequency. The frequency of the signal varies from one rate-setting period to another.

The frequency of this signal is defined by the addition of a control signal or test signal, which is programmable, by steps F1/M of 90 MHz/N or a fine tuning signal with a frequency (F2±dF)/2 of (90 MHz/683)±dF with a signal of 12.5 MHz, and then with a signal of 90 MHz × 102.

The working of the clock can be split up, in fact, into an initial starting stage followed by a normal operation stage for the following of the Ramsey peak.

The normal working stage, for the following of the Ramsey peak, itself periodically comprises elementary test cycles which shall be explained hereinafter.

STARTING STAGE

During the starting stage, the feedback of the quartz oscillator 100 corresponds to a centering on the Ramsey Rabi.

For this, the control means 300 cyclically and alternately apply a signal Fr10 and Fr11, with frequencies of Fr±5 KHz, to the input 202 of the tube 200, during successive periods of 17.92 msec (reference D1 and D2 in FIG. 12(b). These frequencies Fr10 and Fr11 are therefore roughly symmetrical with the central Ramsey line Fr.

These frequencies Fr10, Fr may be generated at the output of the control means 300 in alternately programming, at the output of the frequency synthesizer 310, a frequency F1/N equal to F1/710 and F1/658, namely 126 760 Hz and 136 778 Hz.

Those skilled in the art will easily understand that, as shown in FIG. 5 appended herewith, since the sides of the Ramsey Rabi are symmetrical with the central Ramsey line Fr, if the frequencies Fr10 and Fr11 applied alternately to the tube 200 are not perfectly symmetrical with this central frequency Fr, there are obtained, alternately, at the output of the tube 200, two levels of current Ni1 and Ni2, the difference $\Delta Ni$ of which directly represents the centering error of the frequencies Fr10 and Fr11 with respect to the central Ramsey frequency Fr, hence the frequency error of the quartz oscillator 100 associated with the tube. This difference $\Delta Ni$ may therefore be used to control the feedback of the oscillator 100.

The difference $\Delta Ni$ is reduced when the symmetry of the frequencies Fr10 and Fr11 is improved. It becomes null for a perfect symmetry of the frequencies Fr10 and Fr11

The starting stage, with a view to a centering on the Ramsey Rabi is, therefore, continued until a frequency error is obtained which is smaller than a determined threshold, corresponding, for example, to ±500 Hz, on Fr.

CENTERING ON THE RAMSEY PEAK

The Ramsey peak is followed by applying, to the input 202 of the tube 200 alternately, during the successive 17.92 msec periods (referenced R1, R2 in FIG. 12(c)), a signal Fr20, Fr21 with a frequency equal to Fr±193 Hz. These frequencies are, therefore, centered substantially on the central Ramsey line Fr. These frequencies Fr20, Fr21, are generated at the output of the control means 300 by programming, at the synthesizer 300, frequencies F1/N equal to F1/684 and F1/682 respectively, that is, 139 579 Hz and 131 965 Hz.

The integration of the signals coming from the tube 200 by the circuit 420 begins, as indicated above, with reference to FIG. 9, two msec after the frequency switching-over to eliminate the transient effects. It is then continued for 16 msec in analog form before the digitalization of the signal in the converter 430, and then in digital form until the chosen filtering constant. The difference in current levels collected at the output of the tube 200 is used to drive the oscillator 100.

The feedback loop of the oscillator 100 may work either as to a first order loop, with a filtering constant adjustable by 0.1 to 10 seconds or in the form of a second order loop with a filtering constant that can be set from 0.5 to 100 seconds. This latter mode can be used to eliminate the phase errors which may appear when the oscillator undergoes a heat shock or a gravity variation, especially with high filtering constants.

TEST CYCLE

As indicated above, at regular intervals, two successive 17.92 msec periods (referenced T1, T2 in FIG. 12(d) are allocated not to the following of the Ramsey peak by the programming of the frequencies F1/684 and F1/682 at the output of the synthesizer 310, namely Fr20 and Fr21 at the output of the control means 300, but to a test sequence.

This test sequence may return, for example, at a rate of two 17.92 msec periods T1, T2 for 18 periods, namely every 322.56 msec. The insertion of this sequence is made possible by the fact that the time constant of the feedback loop of the oscillator is great as compared with the measuring cycle comprising two successive periods R1, R2.

During these test periods T1, T2, the central processing unit 500 may alternately program 11 different frequencies $F_1/N$ successively enabling (a) a feedback of the Ramsey/Zeeman frequency difference (b) a measurement of the level of the Ramsey peak with reference to the base line (c) a measurement of the level of the Zeeman peak, (d) a check on the symmetry of the base of the Ramsey peak, and (e) a check on the symmetry of the Ramsey Rabi.

(a) Feedback for Ramsey-Zeeman Frequency Difference

Since the central Ramsey frequency Fr is determined by the main feedback, the Ramsey-Zeeman frequency difference has to be checked to define the central Zeeman frequency.

This search is conducted similarly to that of the main feedback, namely it comprises an initial stage for pre-centering on the Zeeman Rabi, followed by a stage for the following of the fine Zeeman line.

The initial stage for pre-centering on the Zeeman Rabi is achieved by alternately applying test frequencies Fz 10, Fz 11 to the tube 200, during successive test periods T1, T2,. These test frequencies Fz 10, Fz 11 are roughly symmetrical to the central Zeeman line and are, for example, of the order of the central Zeeman frequency ±7 KHz. These frequencies Fz 10 and Fz 11 are generated at the output of control means 300 by programming, at the synthesizer 310, frequencies F1/N equal to F1/525 and F1/486, namely 171 429 Hz and 185 185 Az.

The stage for the following of the fine Zeeman line is achieved by alternately applying frequencies Fz 20 and Fz 21 to the tube 200, during other successive test periods T1, T2. These frequencies Fz 20 and Fz 21 are substantially centered on the central Zeeman frequency, for example, of the order of the central Zeeman frequency, ±300 Hz. These frequencies Fz 20 and Fz 21 are generated at the output of control means 300 by programming, at the synthesizer 310, frequencies F1/N equal to F/506 and F1/504, namely 177 866 Hz and 178 571 Hz.

This feedback system makes it possible to optimize and regulate the Ramsey/Zeeman frequency difference by checking the current applied to the ancillary input 206 of the tube 200 in order to generate the field C. This feedback function is preferably capable of being disconnected, as and when the user wishes it. It makes it possible to eliminate most of the external disturbances that usually act on the tube 200, especially the influences of the earth's field, the effects of the temperature and magnetization of the tube and the instabilities of the field C current.

(b) Checking the Level of the Ramsey Peak with Reference to the Level of the Base Line This check is conducted during test periods T1, T2, for example, every 3225 msec, by alternately applying, to the input 202 of the tube, a frequency Fr signal, centered on the central frequency of Ramsey, and a frequency Fb signal, corresponding to the base line and substantially centered on the Ramsey-Zeeman difference. These frequencies Fr and Fb are generated at the output of the control means 300, in successively programming, at the output of the synthesizer 310, frequencies F1/683 and F1/580, namely 131 772 Hz and 155 172 Hz.

The difference in level between the signals obtained at the output of the tube 200, in respectively applying the two above-mentioned frequencies Fr and Fb, makes it possible to obtain the level of the Ramsey peak with reference to the base line. This level is regulated by correcting the input gain of the feedback loop. This check enables a stabilization of the gain of the loop and of the alarm levels despite the aging of the tube.

(c) Checks on the Level of the Zeeman Peak

This check can be conducted by applying, to the input of the tube 200, during test periods T1 and T2 a frequency Fz centered on the central Zeeman frequency and the frequency Fb signal corresponding to the base line, for example, by programming on the synthesizer 310, a frequency F1/N equal to F1/505 and F1/560, namely 178 218 Hz and 155 172 Hz.

The checking of the level of the Zeeman peak enables checks on the proper functioning of the tube, especially its aging.

(d) Checks on the Symmetry of the Ramsey Peak

To prevent the centering of the quartz oscillator 100 on the base of a dampened stray oscillation juxtaposed with the central Ramsey peak, it is possible to sequentially apply, to the input 202 of the tube 200, during the test periods T1, T2, the frequencies Fr 30, Fr 31, symmetrical with the central Ramsey line and corresponding to the base of the Ramsey peak, for example at Fr±386 Hz. The frequencies Fr 30 and Fr 31 may be generated at the output of the control means 300 by alternately programming, at the synthesizer 310, frequencies F1/N×F1/685 and F1/681, namely 131 387 Hz and 132 159 Hz.

(e) Checks on the Ramsey Rabi

Similarly, a check on the overall centering of the quartz oscillator on the Ramsey Rabi can be obtained by the application to the tube, during successive test periods T1, T2, of frequencies Fr 10 and Fr 11 similar to the frequencies used during the initial starting stage.

Preferably, the central processing unit 500 can also be used to control the offset voltage of the preamplifier 410, to regulate the level of the signal F4 and to check the power of the signal applied to the input 202 of the tube in order to obtain a maximum signal at the output of the tube.

The offset correction voltage which is applied to the resistor R 414 and is picked up at the output of the digital/analog converter 440, corresponds to the mean of the maximum and minimum levels obtained at the output of the integrator 420 during two successive checking periods R1, R2.

The level of the signal F4 is regulated to maintain a maximum modulation depth on the Bessel function J1. For this, the central processing unit directly controls the gain of the output stage of the mixer 374 or of an amplifier stage 377 interposed between the mixers 374 and 375.

A similar regulation can be done on the signal F3 by controlling the gain of the output stage of the mixer 321.

Similarly, a control on the power of the signal applied to the input 202 of the tube to obtain the maximum output signal of the tube is achieved by controlling the gain of the output step 302 of the control means 300. On this point, it will be noted that, until now, two thirds of the maximum gain possible has been the level adopted to prevent saturation.

In addition to the above functions, the central processing unit can measure various operating and temperature voltages, generate different alarm levels and cut off the supply to the tube 200 in the event of a major fault.

Of course, the present invention is not restricted to the particular embodiment described, but can be extended to all variants that are in accordance with its spirit.

The atomic clock according to the present invention, provides for precise reliable analysis of the central peak of the Ramsey response, as well as for a comprehensive analysis of this response. It enables a fine frequency setting without action on the field C, provides for stabilizing the sensitive paramaters in order to reduce the influence of the environment, enables reduction in errors related to the aging of the tube, and enables a reduction in the variation of characteristics among modules to provide for easier interchangeability and maintenance.

What is claimed is:

1. An atomic clock of the type comprising:
   a quartz oscillator,
   a tube containing a material, the atoms of which have a hyperfine spectral transition;
   control means capable of generating, from the quartz oscillator, a control signal of a frequency that corresponds to the hyperfine spectral transition, and of applying this control signal to the tube to cause interaction between this signal and the atoms of the material contained in the tube; and
   feedback means that are sensitive for the response of the tube and are adapted to modifying the frequency of the quartz oscillator so as to substantially center the frequency of the control signal on the frequency of the hyperfine spectral transition,
   wherein the control means are adapted for cyclically generating test signals, the controlled frequency of which is located outside the Ramsey peak.

2. An atomic clock according to claim 1 wherein the tube is a tube of cesium.

3. An atomic clock according to either of the claims 1 or 2, wherein the control means include a microprocessor-controlled, fast switching-over frequency synthesizer having small frequency steps.

4. An atomic clock according to claim 3, wherein the operating range of the frequency synthesizer is of the order of 55 KHz.

5. An atomic clock according to claim 3, wherein the frequency steps of the synthesizer are of the order of 150 to 380 Hz.

6. An atomic clock according to claim 1, wherein the control means include:
   means to define a base signal F1 of 90 MHz,
   synthesizing means to define a programmable frequency signal of 90 MHz/N,
   means to add the programmable frequency signal of 90 MHz/N to a 12.5 MHz signal, then a 90 MHz signal and to multiply the frequency of the signal obtained by 102.

7. An atomic clock according to claim 6, wherein the number N is programmable from 504 to 710.

8. An atomic clock according to claim 1, wherein the control means are adapted, for alternately generating, when put into operation, two frequencies Fr10, Fr11 which are substantially symmetrical with respect to the central Ramsey line and are included in the Ramsey Rabi.

9. An atomic clock according to claim 8, wherein the two frequencies Fr10, Fr11, alternately generated by the control means, are of the order of Fr±5 KHz, Fr representing the frequency of the hyperfine spectral transition.

10. An atomic clock according to claim 8, wherein the control means include:
    means to define a base signal F1 of 90 MHz,
    synthesizing means to define a programmable frequency signal of 90 MHz/N,
    means to add the programmable frequency signal of 90 MHz/N to a 12.5 MHz signal, then a 90 MHz signal and to multiply the frequency of the signal obtained by 102,
    wherein the two frequencies Fr10, Fr11, alternately generated by the control means, are obtained by alternately programming 90 MHz/710 and 90 MHz/658 signals on the synthesizer means.

11. An atomic clock according to claim 1, wherein the control means are adapted for alternately generating, when the central Ramsey line is being followed, two main frequencies Fr20, Fr21, which are substantially symmetrical with respect to the central Ramsey line, and are included in the Ramsey peak.

12. An atomic clock according to claim 11, wherein the two main frequencies Fr20, Fr21, alternately generated by the control means, are of the order of Fr±193 Hz, Fr representing the frequency of the hyperfine spectral transition.

13. An atomic clock according to claim 11, wherein the control means include:
    means to define a base signal F1 of 90 MHz,
    synthesizing means to define a programmable frequency signal of 90 MHz/N,
    means to add the programmable frequency signal of 90 MHz/N to a 12.5 MHz signal, then a 90 MHz signal and to multiply the frequency of the signal obtained by 102,
    wherein the two main frequencies Fr20, Fr21, alternately generated by the control means, are obtained by alternately programming 90 MHz/684 and 90 MHz/682 signals on the synthesizing means.

14. An atomic clock according to claim 1, wherein the control means alternately generate, during successive rate-setting periods, two main frequencies which are substantially symmetrical with respect to the central Ramsey line and are included in the Ramsey peak, the two main frequencies Fr20, Fr21 being replaced at regular intervals by test frequencies, Fr10, Fr11, Fr, Fr30, Fr31; Fz, Fz10, Fz11, Fz20, Fz21, Fb.

15. An atomic clock according to claim 14, wherein the test frequencies comprise at least one pair of frequencies, Fz10, Fz11; Fz20, Fz21, symmetrical with the Zeeman line.

16. An atomic clock according to claim 15, wherein the test frequencies comprise a first pair of frequencies, Fz10, Fz11, symmetrical with the Zeeman line and included in the Zeeman Rabi, and a second pair of frequencies, Fz20, Fz21, symmetrical with the Zeeman line and included in the Zeeman peak.

17. An atomic clock according to claim 16, wherein the test frequencies comprise a first pair of frequencies, Fz10, Fz11, of the order of Fz±7 KHz and a second pair of frequencies, Fz20, Fz21, of the order of Fz±300 Hz.

18. An atomic clock according to claim 15, wherein the control means include:
    means to define a base signal F1 of 90 MHz,
    synthesizing means to define a programmable frequency signal of 90 MHz/N,
    means to add the programmable frequency signal of 90 MHz/N to a 12.5 MHz signal, then a 90 MHz signal and to multiply the frequency of the signal obtained by 102,
    wherein the test frequencies comprise a first pair of frequencies Fz10, Fz11 defined by alternately programming 90 MHz/525 and 90 MHz/486 on the synthesizer means and a second pair of frequencies Fz20, Fz21 defined by alternately programming 90 MHz/506 and 90 MHz/504 on the synthesizer means.

19. An atomic clock according to claim 15, wherein the test frequencies Fz10, Fz11; Fz20, Fz21, centered on the Zeeman line, are used for a feedback control of the Ramsey-Zeeman frequency difference through the control of the field C on the tube.

20. An atomic clock according to claim 14, wherein the test frequencies comprise a frequency Fr centered on the Ramsey line and a frequency Fb centered on the Ramsey-Zeeman interval.

21. An atomic clock according to claim 20, wherein the frequency Fr centered on the Ramsey line is defined by programming the frequency 90 MHz/683 on the synthesizer means, and the frequency Fb centered on the Ramsey-Zeeman interval is defined by programming the frequency of 90 MHz/580 on the synthesizer means.

22. An atomic clock according to claim 20, wherein the input gain of the feedback means is set to maintain, at a constant value, the difference in the levels of the output signals of the tube during the successive application of the frequency Fr, centered on the Ramsey line, and the frequency Fb, centered on the Ramsey-Zeeman interval.

23. An atomic clock according to claim 14, wherein the test frequencies have a frequency Fz centered on the Zeeman peak.

24. An atomic clock according to claim 23, wherein the control means include:
    means to define a base signal F1 of 90 MHz,
    synthesizing means to define a programmable frequency signal of 90 MHz/N,
    means to add the programmable frequency signal of 90 MHz/N to a 12.5 MHz signal, then a 90 MHz signal and to multiply the frequency of the signal obtained by 102, wherein the frequency Fz centered on the Zeeman peak is defined by programming the 90 MHz/505 frequency on the synthesizer means.

25. An atomic clock according to claim 14, wherein the test frequencies have two frequencies, Fr30, Fr31, symmetrical with the Ramsey line and located at the base of the Ramsey peak.

26. An atomic clock according to claim 25, wherein the test frequencies Fr30, Fr31 located at the base of the Ramsey peak are of the order of Fr±386 Hz, Fr representing the frequency of the hyperfine spectral transition.

27. An atomic clock according to claim 25 wherein the control means include:
   means to define a base signal F1 of 90 MHz,
   synthesizing means to define a programmable frequency signal of 90 MHz/N,
   means to add the programmable frequency signal of 90 MHz/N to a 12.5 MHz signal, then a 90 MHz signal and to multiply the frequency of the signal obtained by 102,
   wherein the frequencies Fr30, Fr31, located at the base of the RAmsey peak, are defined by alternately programming the 90 MHz/685 and 90 MHz/681 frequencies on the synthesizer means.

28. An atomic clock according to claim 14, wherein the test frequencies comprise two frequencies Fr10, Fr11, which are substantially symmetrical with respect to the central Ramsey line and are included in the Ramsey Rabi according to claim 8.

29. An atomic clock according to claim 1, wherein the control means include a vernier enabling a fine tuning of the frequency of the control signal.

30. An atomic clock according to claim 29, wherein the vernier comprises:
   first slope generator recurrent at a frequency of the order of the basic frequency of the control signal,
   a second slope generator recurrent at the rate-setting frequency of the control means,
   means to program the amplitude and polarity of the inclination of the slope coming from the second generator, and
   a comparator, the inputs of which respectively receive the slopes coming from the two generators.

31. An atomic clock according to claim 1, including amplifier/integrator means connected between the output of the tube and an analog/digital converter, said amplifier/integrator means comprising:
   an analog gate with four inputs and one output, and
   an integrator stage, such that two states of the analog gate enable a choice of gain by switching over of resistors, a third state of the gate enables a memorizing of the level obtained at the integration capacitor and the fourth state of the gate defines the discharge of the integration capacitor.

32. An atomic clock according to claim 1, wherein the feedback of the quartz oscillator is defined by:
   integrator with its input connected to a
   digital/analog converter by means of
   an analog gate with a controlled closing time.

* * * * *

UNITED STATES PATENT AND TRADEMARK OFFICE
CERTIFICATE OF CORRECTION

PATENT NO. : 4,943,955
DATED : 7/24/90
INVENTOR(S) : Rabian et al.

It is certified that error appears in the above-identified patent and that said Letters Patent is hereby corrected as shown below:

| | | |
|---|---|---|
| col. 04, line 06 | after "signal" | insert --of-- |
| col. 07, line 44 | delete "33" | insert --333-- |
| col. 08, line 55 | after "output" | insert --.-- |
| col. 10, line 20 | delete "$\pm 2.10^{31\ 7}$" | insert --$\pm 2.10^{-7}$-- |
| col. 10, line 22 | delete "15" | |
| col. 10, line 26 | delete "$10^{31\ 13}$" | insert --$10^{-13}$-- |
| col. 11, line 08 | after "Fr" | insert --11-- |
| col. 11, line 30 | after "Fr11" | insert --.-- |
| col. 12, line 12 | after "this" | insert --test-- |
| col. 13, line 04 | delete "Checkinq" | insert --Checking-- |
| col. 13, line 50 | delete "F1/N x F1/685" | insert --F1/N = F1/685-- |
| col. 17, line 23 | delete "RAmsey" | insert --Ramsey-- |

Signed and Sealed this

Twenty-seventh Day of April, 1993

Attest:

MICHAEL K. KIRK

Attesting Officer

Acting Commissioner of Patents and Trademarks